(12) United States Patent
Stautner

(10) Patent No.: US 12,066,233 B2
(45) Date of Patent: Aug. 20, 2024

(54) REMOTELY DRIVEN CRYOCOOLER FOR A SUPERCONDUCTING GENERATOR

(71) Applicant: General Electric Company, Schenectady, NY (US)

(72) Inventor: Ernst Wolfgang Stautner, Niskayuna, NY (US)

(73) Assignee: GENERAL ELECTRIC RENOVABLES ESPAÑA, S.L., Barcelona (ES)

( * ) Notice: Subject to any disclaimer, the term of this patent is extended or adjusted under 35 U.S.C. 154(b) by 369 days.

(21) Appl. No.: 17/256,313

(22) PCT Filed: Jun. 29, 2018

(86) PCT No.: PCT/US2018/040492
§ 371 (c)(1),
(2) Date: Dec. 28, 2020

(87) PCT Pub. No.: WO2020/005300
PCT Pub. Date: Jan. 2, 2020

(65) Prior Publication Data
US 2021/0262701 A1    Aug. 26, 2021

(51) Int. Cl.
*F25B 9/10*    (2006.01)
*F25B 9/14*    (2006.01)
(Continued)

(52) U.S. Cl.
CPC ............... *F25B 9/10* (2013.01); *F25B 9/14* (2013.01); *F25D 19/006* (2013.01);
(Continued)

(58) Field of Classification Search
CPC ... F25B 9/14; F25B 9/006; F25B 9/10; G01R 33/3804; H01F 6/04
See application file for complete search history.

(56) References Cited

U.S. PATENT DOCUMENTS

| | | |
|---|---|---|
| 4,771,823 A | 9/1988 | Chan |
| 5,111,874 A | 5/1992 | Kosson |

(Continued)

FOREIGN PATENT DOCUMENTS

| | | |
|---|---|---|
| CN | 101109583 A | 1/2008 |
| CN | 102713465 A | 10/2012 |

(Continued)

OTHER PUBLICATIONS

CN Office Action, Dec. 7, 2021.
(Continued)

*Primary Examiner* — Nael N Babaa
(74) *Attorney, Agent, or Firm* — Dority & Manning, P.A.

(57) ABSTRACT

A cryocooler assembly including at least one remotely driven cryocooler operable between an ON-state of operation and an OFF-state of operation and defining a first stage of the cryocooler assembly. A liquefaction cup in fluidic communication with a cryogenic fluid reservoir, wherein a plurality of conduits thermally couple the liquefaction cup to the fluid reservoir and define a second stage of the cryocooler assembly. The cryocooler assembly further including one or more of a valve, a gas/liquid switch, an actuating support arm and a heat pipe coupled to the second stage of the cryocooler assembly to remotely disconnect a heat path generated by the at least one remotely driven cryocooler between the first stage and the second stage during the OFF-state of operation. A superconducting generator including at least one remotely driven cryocooler assembly and method of operating a cooling assembly for a superconducting generator utilizing at least one remotely driven cryocooler assembly are disclosed.

11 Claims, 14 Drawing Sheets

(51) Int. Cl.
  *F25D 19/00*    (2006.01)
  *G01R 33/38*    (2006.01)
  *G01R 33/3815*  (2006.01)
  *H01F 6/04*     (2006.01)

(52) U.S. Cl.
  CPC ..... *G01R 33/3804* (2013.01); *G01R 33/3815* (2013.01); *H01F 6/04* (2013.01)

(56)        References Cited

U.S. PATENT DOCUMENTS

| | | |
|---|---|---|
| 5,379,601 A    | 1/1995  | Gillett |
| 5,430,423 A    | 7/1995  | Herd et al. |
| 6,276,144 B1   | 8/2001  | Marland et al. |
| 6,438,966 B1   | 8/2002  | Sarwinski et al. |
| 2008/0115510 A1 | 5/2008  | Crowley et al. |
| 2012/0081117 A1 | 4/2012  | Jiang et al. |
| 2013/0104570 A1 | 5/2013  | Stautner |
| 2014/0100113 A1 | 4/2014  | Stautner et al. |
| 2015/0332829 A1 | 11/2015 | Stautner et al. |
| 2017/0038100 A1 | 2/2017  | Quigley |

FOREIGN PATENT DOCUMENTS

| | | |
|---|---|---|
| GB | 2538512 A    | 11/2016 |
| JP | H09217964 A  | 8/1997  |
| JP | 2003013854 A | 1/2003  |

OTHER PUBLICATIONS

PCT Search Report, Mar. 26, 2019.
Supplementary European Search Report for EP application No. 18924146.6, mail date of May 30, 2022.

REMOTELY DRIVEN CRYOCOOLER FOR A SUPERCONDUCTING GENERATOR

BACKGROUND

Embodiments of the present disclosure generally relate to a cooling system and more particularly, to a remotely driven cryocooler for use in a cryogenic cooling system of a superconducting generator.

Superconducting magnets are used in various apparatus such as, but not limited to, superconducting rotors for electric generators and motors, magnetic resonance imaging (MRI) systems for medical diagnosis, magnetic levitation devices for train transportation, nuclear fusion and large fault current limiting devices.

Conventional superconducting magnets include at least one superconducting coil that typically has to be thermally isolated from the environment. Some superconducting magnets are conductively cooled by a cryocooler (such as that of a conventional Gifford-McMahon (GM) or pulse tube cryocooler) whose housing is hermetically connected to the vacuum enclosure, whose first stage extends from the housing into the vacuum enclosure to be in thermal contact with the thermal shield, and whose second stage extends from the first stage to be in thermal contact with the superconducting coil. Typical cryogenic cooling systems that use a GM type cryocooler, e.g. a Cryomech® or Sumitomo R (SHI) cold head model RDK for MRIs, run with one cryocooler installed that provides the cooling capacity required. Some known MRI systems require two cryocoolers but in this case, both coolers are permanently running.

In a system incorporating more than one cryocooler, such as in a redundant or backup situation, any cryocooler that is installed and ready to cool, but not operating, introduces parasitic heat to the system, caused by one or more of thermal radiation and thermal conduction along the cooler tube. If cooler does not run, the cooler is essentially at room temperature, introducing heat to the areas the stages are in contact with.

Thus, an improved cryogenic cooling system is needed that employs a plurality of cryocoolers in which one or more cryocoolers is in an idling or OFF-state of operation without introducing parasitic heat to the system. In addition, a means for remotely driving the idling or OFF-state of operation cryocooler is needed.

BRIEF DESCRIPTION

Various embodiments of the disclosure provide a cryocooler assembly. The cryocooler assembly including at least one remotely driven cryocooler, a liquefaction cup and one or more of a valve, a gas/liquid switch, a support arm and a heat pipe. The at least one remotely driven cryocooler is operable between an ON-state of operation and an OFF-state of operation and defines a first stage of the cryocooler assembly. The liquefaction cup is in fluidic communication with a cryogenic fluid reservoir. A plurality of conduits thermally couple the liquefaction cup to the cryogenic fluid reservoir and define a second stage of the cryocooler assembly. The one or more of a valve, a gas/liquid switch, a support arm and a heat pipe are coupled to the second stage of the cryocooler assembly to remotely disconnect a heat path generated by the at least one remotely driven cryocooler between the first stage and the second stage during the OFF-state of operation.

In accordance with another exemplary embodiment, disclosed is a superconducting generator including a housing, at least one superconducting field winding, a thermal shield, and a cooling assembly. The housing extends a first length and defines an insulating vacuum enclosure therein. The at least one superconducting field winding is disposed within the insulating vacuum enclosure and spaced apart from the housing. The thermal shield is disposed within the insulating vacuum enclosure and surrounding and spaced apart from the at least one superconducting field winding. The cooling assembly is in fluid communication with the at least one superconducting field winding. The cooling assembly includes at least one cryocooler assembly and at least one additional cryocooler assembly. The at least one cryocooler assembly is operable between an ON-state of operation and an OFF-state of operation. The at least one additional cryocooler assembly is operable between an ON-state of operation and an OFF-state of operation. The at least one additional cryocooler includes a remotely driven cryocooler, a liquefaction cup and one or more of a valve, a gas/liquid switch, a support arm and a heat pipe. The remotely driven cryocooler is operable between an ON-state of operation and an OFF-state of operation and defines a first stage of the at least one additional cryocooler assembly. The liquefaction cup is in fluidic communication with a cryogenic fluid reservoir. A plurality of conduits thermally couple the liquefaction cup to the fluid reservoir and define a second stage of the at least one additional cryocooler assembly. The one or more of a valve, a gas/liquid switch, a support arm and a heat pipe are coupled to the second stage of the at least one additional cryocooler assembly to remotely disconnect a heat path generated by the at least one additional cryocooler assembly between the first stage and the second stage during the OFF-state of operation.

In accordance with yet another exemplary embodiment, disclosed is a method of operating a cooling assembly for a superconducting generator. The cooling assembly includes a first cryocooler assembly and at least one remotely driven cryocooler assembly. The method including operating the first cryocooler assembly in an ON-state of operation and the at least one remotely driven cryocooler assembly in an OFF-state of operation. A heat path is generated between a first stage and a second stage of the at least one remotely driven cryocooler assembly during the OFF-state of operation. The method further including remotely actuating one or more of a valve, a gas/liquid switch, a support arm and a heat pipe coupled to the second stage of the at least one remotely driven cryocooler assembly to remotely disconnect the heat path from the first stage of the at least one remotely driven cryocooler. Operation of the first cryocooler continued until one of failure of the first cryocooler or additional cooling power is required. At this stage, the one or more of a valve, the gas/liquid switch, the support arm and the heat pipe, coupled to the second stage of the at least one remotely driven cryocooler assembly is remotely actuated remotely connect the heat path from the first stage of the at least one remotely driven cryocooler to the second stage of the at least one remotely driven cryocooler.

Other objects and advantages of the present disclosure will become apparent upon reading the following detailed description and the appended claims with reference to the accompanying drawings.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
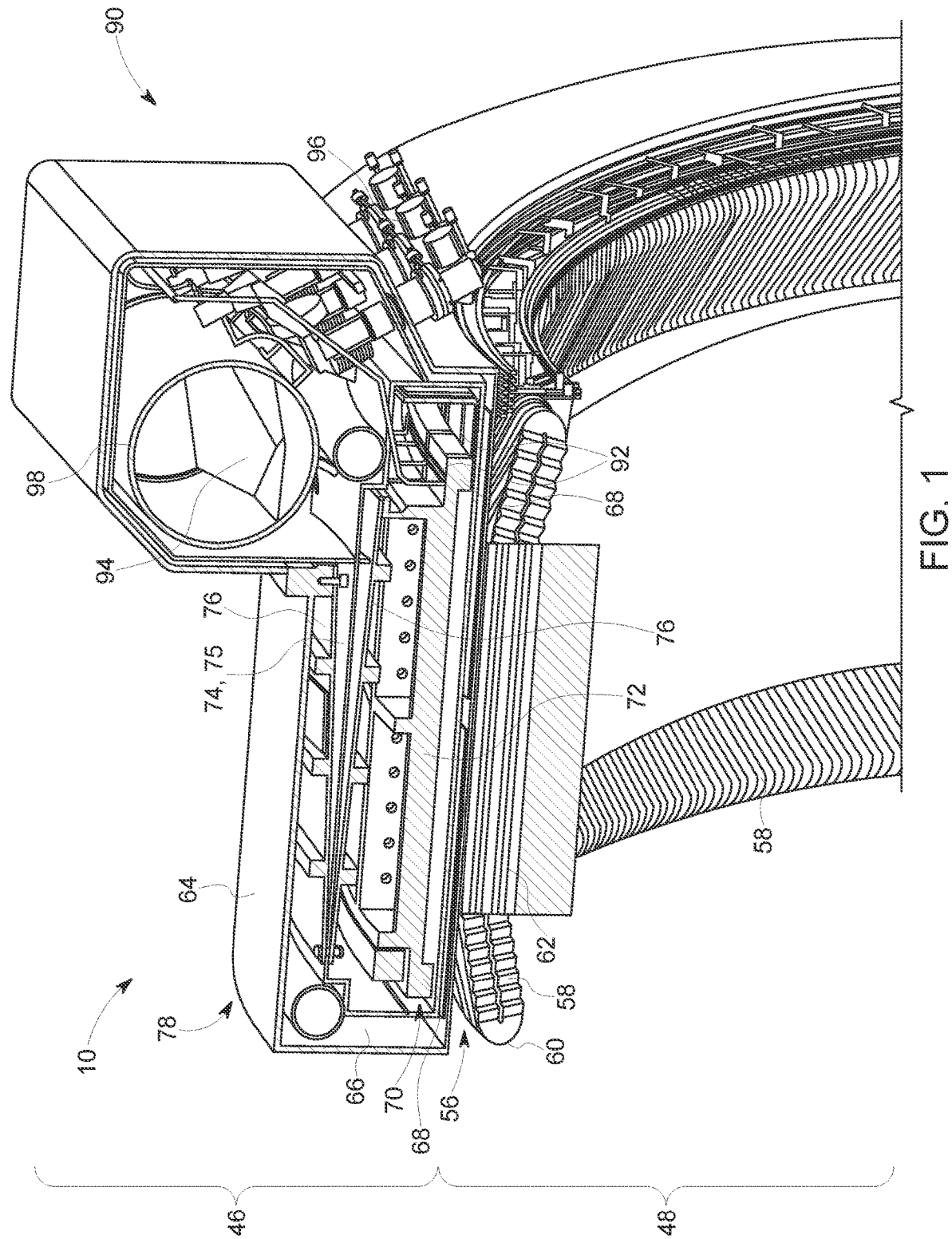
FIG. 1 is a schematic diagram of a superconducting generator, in accordance with one or more embodiments shown or described herein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

It is noted that the drawings as presented herein are not necessarily to scale. The drawings are intended to depict only typical aspects of the disclosed embodiments, and therefore should not be considered as limiting the scope of the disclosure. In the drawings, like numbering represents like elements between the drawings.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In an effort to provide a concise description of these embodiments, all features of an actual implementation may not be described in the disclosure. It should be appreciated that in the development of any such actual implementation, as in any engineering or design project, numerous implementation-specific decisions may be made to achieve the developer's specific goals such as compliance with system-related and business-related constraints.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect.

As used herein, the terms "may" and "may be" indicate a possibility of an occurrence within a set of circumstances: a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

Referring now to FIG. 1, illustrated in a simplified isometric view is a superconducting generator 10, in accordance with an embodiment of the present disclosure. The superconducting generator 10 is configured to generate electrical power based on the rotations of an armature (described presently) relative to the stationary field. The superconducting generator 10 may be implemented in the form of a synchronous generator. Without limiting the scope of the present application, the superconducting generator 10 may be a schematic representation of an embodiment used in a wind turbine or any application other than wind turbines, such as an MRI, or the like. Although the superconducting generator 10 depicted in FIG. 1 is a radial field electric machine, embodiments of the present disclosure are also applicable to axial field or transverse field superconducting generators.

As depicted in FIG. 1, the superconducting generator 10 includes a stationary field 46 and the annular rotating armature 48 disposed in a cylindrical housing 50. The stationary field 46 includes superconducting field winding 70 that is configured to generate a magnetic field oriented in the radial direction of the superconducting generator 10. The annular rotating armature 48 may include a non-superconducting armature winding 58.

The stationary field 46 is disposed adjacent to, and concentrically outside, the annular rotating armature 48. As used herein, the term "disposed adjacent to" with respect to positioning of the stationary field 46 and the annular rotating armature 48, refers to relative positioning of the stationary field 46 and the annular rotating armature 48 such that the annular rotating armature 48 is surrounded by the stationary field 46. In another embodiment, the term "disposed adjacent to" refers to relative positioning of the stationary field 46 and the annular rotating armature 48 such that the stationary field 46 is surrounded by the annular rotating armature 48 (not shown). The stationary field 46 and the annular rotating armature 48 are separated by an air gap 56.

The annular rotating armature 48 includes the conductive armature windings 58 (e.g., coils or bars) arranged longitudinally along the length of the annular rotating armature 48 and on an inside cylindrical surface of the annular rotating armature 48. In the exemplary embodiment, the conductive armature windings 58 are coupled at their opposite ends to one another by conductive end turns 60. A cylindrical yoke 62 supports the conductive armature windings 58. An outer surface of the cylindrical yoke 62 is fixed to a cylindrical housing. The cylindrical housing rotates along with the annular rotating armature 48.

The stationary field 46 includes an annular housing 64, defining an insulating vacuum enclosure 66, and a plurality of components disposed within the annular housing 64. The annular housing 64 and the plurality of components disposed therein form a cryostat 78. Disposed within the annular housing 64 is a superconducting field winding 70 comprised of a plurality of race track or oval shaped coils 68 and a field coil former 72 that carries or mechanically supports the individual field coils 68. The insulating vacuum enclosure 66 is formed around a thermal shield 74 and the superconducting field winding 70. The thermal shield 74 encloses the superconducting field winding 70 and aids in maintaining the temperature of the superconducting field winding 70 to the cryogenic temperatures. The thermal shield 74 is suspended in the insulating vacuum enclosure 66 via a dual torque tube assembly 76. The torque tube assembly 76 is configured to thermally isolate the superconducting field winding 70 and to receive torque experienced by the superconducting field winding 70.

The superconducting generator 10 further includes a cooling assembly 90 for cooling and maintaining the superconducting field winding 70 at cryogenic temperatures. The cooling assembly 90 may include a plurality of conduits 92 for receiving a cryogenic fluid 94, for example liquid helium and one or more cryocoolers 96, indirectly coupled to the superconducting field winding 70 and the torque tube assembly 76. A reservoir 98 is typically used to store the cryogenic fluid 94. Although the stationary field 46 is shown as including a single reservoir 98, use of two or more than two such reservoirs for holding the cryogenic fluid 94 is also envisioned within the scope of the present disclosure. Non-limiting examples of the cryogenic fluid 94 may include any type of gaseous or condensed cooling fluids, such as the previously mentioned liquid helium. The conduits 92 are configured to facilitate flow of the cryogenic fluid 94 within the stationary field 46. The cryogenic fluid 94 is fed around the superconducting field winding 70 so as to cool the superconducting field winding 70 to achieve a superconducting condition for the superconducting field winding 70. While being circulated, the cryogenic fluid 94 removes any heat deposited onto or into the low-temperature structure and the superconducting field winding 70 (such as from radiation or conduction heat transfer or from eddy current heating created by generator operation), thereby maintaining the superconducting field winding 70 at the cryogenic temperatures.

The cooling assembly 90 is further configured to retain and take up the torque, as well as bear the weight of the superconducting generator 10. In addition, the cooling assembly 90 is configured to insulate the warm end of the torque tube assembly 76 from the superconducting field winding 70 so that the superconducting field winding 70 is cooled to close or below 4 K.

As previously stated, the cooling assembly 90 includes redundant cryocoolers (described presently) in which one or more cryocoolers remain in an engaged, but OFF-state of operation (idle state) until their use is required for cooling, based on the exhausted useful life of a cooling cryocooler in the assembly or when and where additional cooling is required, such as during an operating mode that requires additional cooling for a period of time, during a temporary cryocooler failure or when cryocooler servicing/maintenance is being performed.

Figure 2:
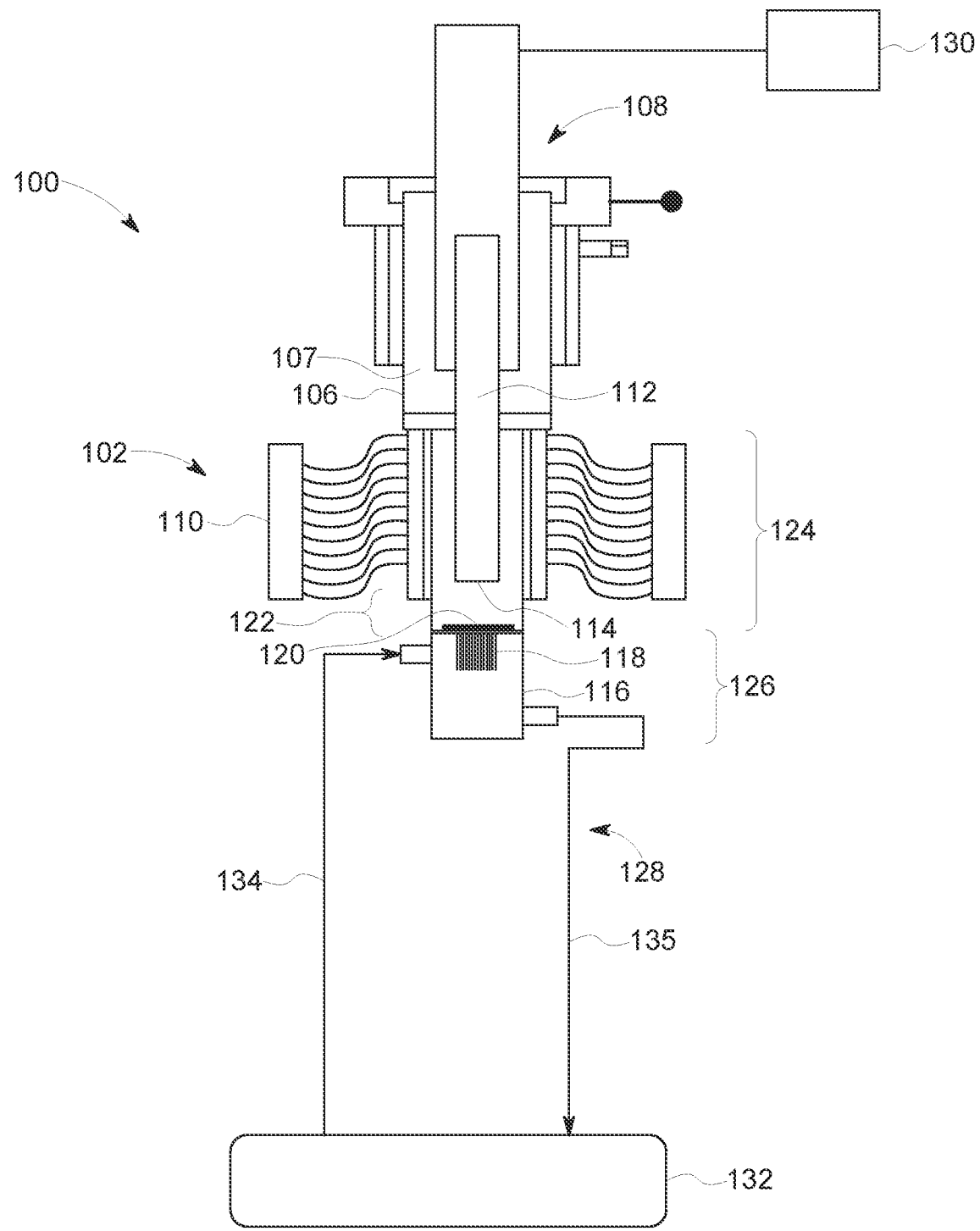
FIG. 2 is a schematic diagram of a cryocooler of FIG. 1 in a disengaged and OFF-state of operation, in accordance with one or more embodiments shown or described herein.
Figure 3:
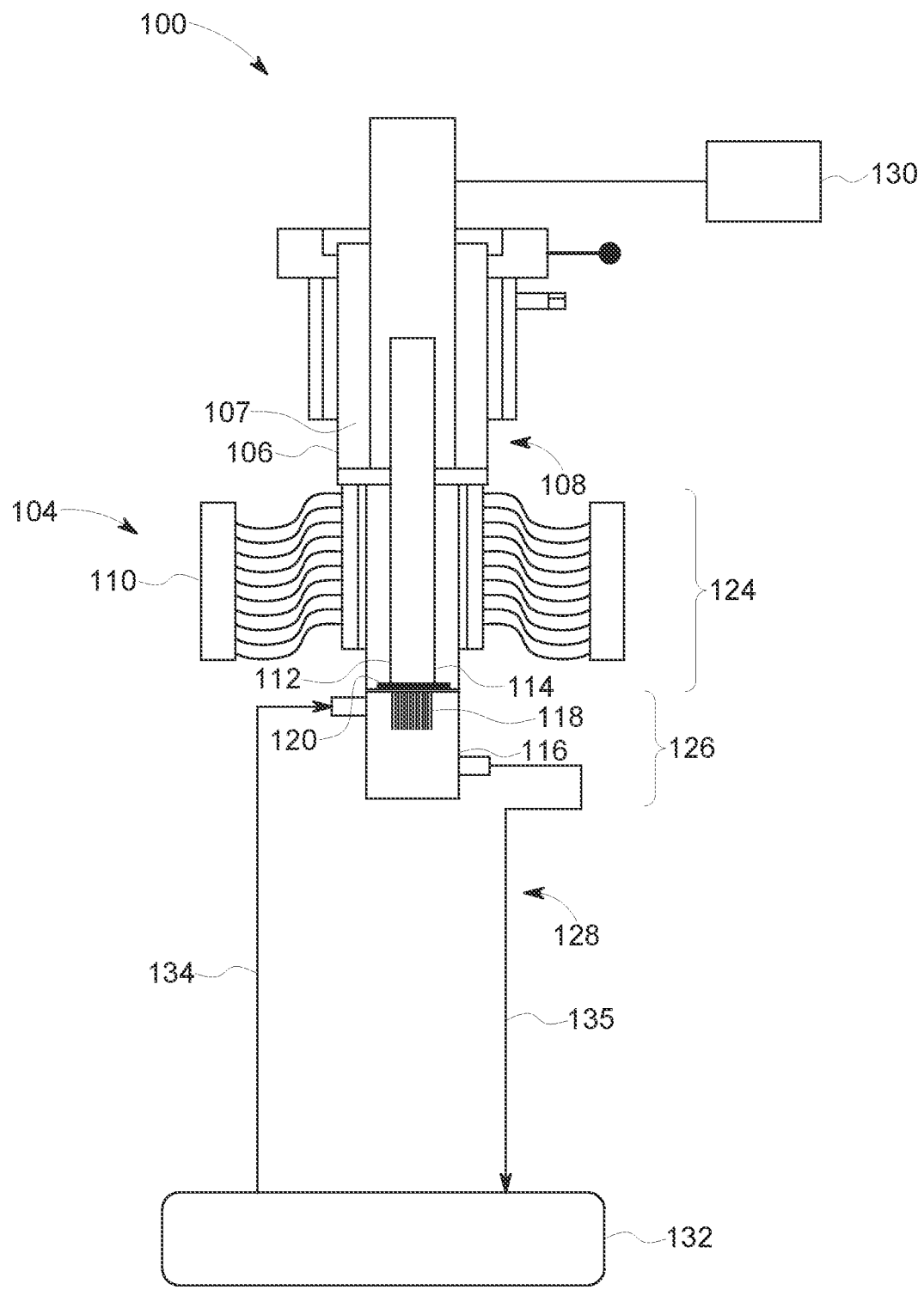
FIG. 3 is a schematic diagram of the cryocooler of FIG. 2 in an engaged and OFF-state of operation, in accordance with one or more embodiments shown or described herein.

FIGS. 2 and 3 illustrate in cross-sectional views, a cryocooler assembly 100 for use in cooling the stationary superconducting field winding assembly 70 of FIG. 1. FIG. 2 illustrates the cryocooler assembly 100 in a disengaged, OFF-state of operation 102. FIG. 3 illustrates the cryocooler assembly 100 in an engaged, ON-state of operation 104. The cryocooler assembly 100 includes a sleeve 106 into which a cryocooler 108 is disposed. The cryocooler assembly 100 is indirectly coupled to the stationary superconducting field winding assembly 70 by a thermal connector or braid 110. The cryocooler assembly 100, and more particularly, the sleeve 106, is configured to provide a vacuum insulated enclosure 107 for insertion of the cryocooler 108. In the exemplary embodiment, the cryocooler 108 may be a pulse tube, GM or Stirling type cryocooler.

In the illustrated embodiment, the cryocooler 108 is a two-stage cooler for cooling the superconducting field winding coil former 72 (FIG. 1) of the field winding assembly 70. More specifically, the cryocooler includes a first stage 124 and a second stage 126. In the embodiment of FIGS. 2 and 3, the first stage 124 is coupled (not shown) to the stationary superconducting field winding assembly 70 and more particularly, the thermal shield 74 via the thermal connector or braid 110. The second stage 126 is coupled to a cryogenic fluid reservoir 132, generally similar to the tank 98 of FIG. 1, located below the cryocooler 108. Flexible conduits 134, 135 (e.g., high-pressure bearing braided flexible tubes) are used for thermal connection between the second-stage 126 and the cryogenic fluid reservoir 132 as well as protection of the second-stage 126, and more particularly a coldhead (described presently), from thermal contraction, and define a heat path 128.

As illustrated in FIGS. 2 and 3, the cryocooler 108 includes a portion 112 having a coldhead 114 and is inserted at least partially into the sleeve 106 of the cryocooler assembly 100. The sleeve 106 includes a contact plate 120, such as an EB-welded or brazed copper plate, at a lower end as a contact surface. A liquefaction cup 116 is separately attached to the cryocooler 108. The coldhead 114 is configured in good contact with a plurality of liquefaction fins 118 within the liquefaction cup 116 via the contact plate 120. In the exemplary embodiment, the cryocooler 108 is configured to translate axially within the sleeve 106 to establish selective contact between the coldhead 114, the contact plate 120 of the liquefaction fins 118 within the liquefaction cup 116.

In the disengaged position 102, shown in FIG. 2, the coldhead 114 is distanced from the contact plate 120, and thus the liquefaction fins 118, by a gap 122. The cryocooler 108 is in an OFF-state of operation when in the disengaged position 102. In the engaged position 104, shown in FIG. 3, the coldhead 114 is translated across the gap 122 (FIG. 2) and into thermal engagement with the contact plate 120 and liquefaction fins 118. The cryocooler 108 may be in an OFF-state of operation or an ON-state of operation when in the engaged position 104. An actuator 130 is used to engage and disengage the coldhead 114 using a compression force. More particularly, the actuator 130 is configured to translate the cryocooler coldhead 114 into thermal engagement with the contact plate 120 and to maintain constant pressure of the coldhead 114 against the contact plate 120 to facilitate maintaining thermal engagement with the contact plate 120. In an embodiment, the actuator 130 includes at least one of a hydraulic actuator, a pneumatic actuator, an electric actuator, a piezoelectric actuator, a moving iron controllable actuator, and a vacuum. A controller (not shown) is operatively coupled to the actuator 130 to control the actuator 130 to selectively thermally couple the coldhead 114 to the contact plate 120. In an embodiment, the actuator 130 is remotely driven.

During a cool down operation, the effectiveness of the cold head 114 and/or the thermal connection between the coldhead 122 and the contact plate 120 and liquefaction fins 118 of the liquefaction cup 116 may become broken. In response the cryocooler assembly 100 is typically configured to continue pressing the coldhead 114 toward the contact plate 120 to facilitate maintaining constant pressure of the coldhead 114 against the contacting plate 120. As such, thermal engagement is maintained with the liquefaction fins 118 during the cool down process. In a known embodiment, indium wire of 1.5 mm thickness is utilized at, or in lieu of, the contact plate 120 and compressed using a large compression force. However, the coldhead 114 cannot be easily separated or removed for service due to the indium cold soldering that takes place between the coldhead 114 and the contact plate 120.

During operation if the cryocooler is in an OFF-state of operation, but engaged such that the coldhead 114 remains thermally coupled to the contact plate 120, such as illustrated in FIG. 3, the cryocooler assembly 100 is subject to a heat load by conduction through the first stage 124 and the second stage 126. The cold head 114 may act as a heat load once the liquid helium cools the stationary superconducting field winding assembly 70 below the temperature of coldhead 114 (e.g., below 20 K). If cryocooler is in OFF-state of operation, and not engaged with the contact plate 120, such as illustrated in FIG. 2 the cryocooler assembly 100 is subject to a heat load by radiation through the first stage 124, the second stage 126 and the sleeve 106.

As previously stated, in a redundant cryocooler system, a cryocooler that is installed ready to cool but not operating, introduces parasitic heat to the system, caused by at least one of thermal radiation and thermal conduction as described with regard to the cryocooler assembly of FIGS. 2 and 3. When the cryocooler is in an OFF-state of operation and is idling, the cooler is at near room temperature and introduces heat to the areas that the first and second stages are in contact with. As used herein, the term "idling" means the cryocooler is in an OFF-state of operation and not operating: this includes operation at even a low power.

In each of the below disclosed embodiments, described is a cryocooler assembly for use in a redundant system, whereby one or more cryocoolers are in an idling state, while other cryocoolers are in operation. The described cryocooler assembly is remotely driven and includes autoengagement as previously described. During operation of the redundant system, if one of the operating cryocoolers fails, the failed cryocooler is disengaged automatically. This automatic disengagement is achieved by applying heat to room temperature, to the lower portion of the sleeve (containing the contact plate), providing disengagement of the coldhead, and allowing the cryocooler to be retracted with minimal to no use of force to the sleeve. At this time, a redundant parallel remotely driven cryocooler is engaged providing contact with the contact plate.

As previously described, in an attempt to install redundant cryocoolers, the below cryocooler assemblies are remotely driven enabling the cryocooler to idle when not in use, and autoengage and be remotely driven when use is required. Accordingly, one or more specific embodiments of the present techniques will be described below. In an effort to provide a concise description of these embodiments, not all features of an actual implementation are described in the specification. Referring now to FIGS. 4-9, as previously stated, provided are alternative configurations for a remotely driven, autoengageable cryocooler assembly for use in a redundant cryocooler configuration. Components in FIGS. 4-9 that are identical to components of FIGS. 2 and 3 are identified in FIGS. 4-9 using the same reference numerals used in FIGS. 2 and 3.

Figure 4:
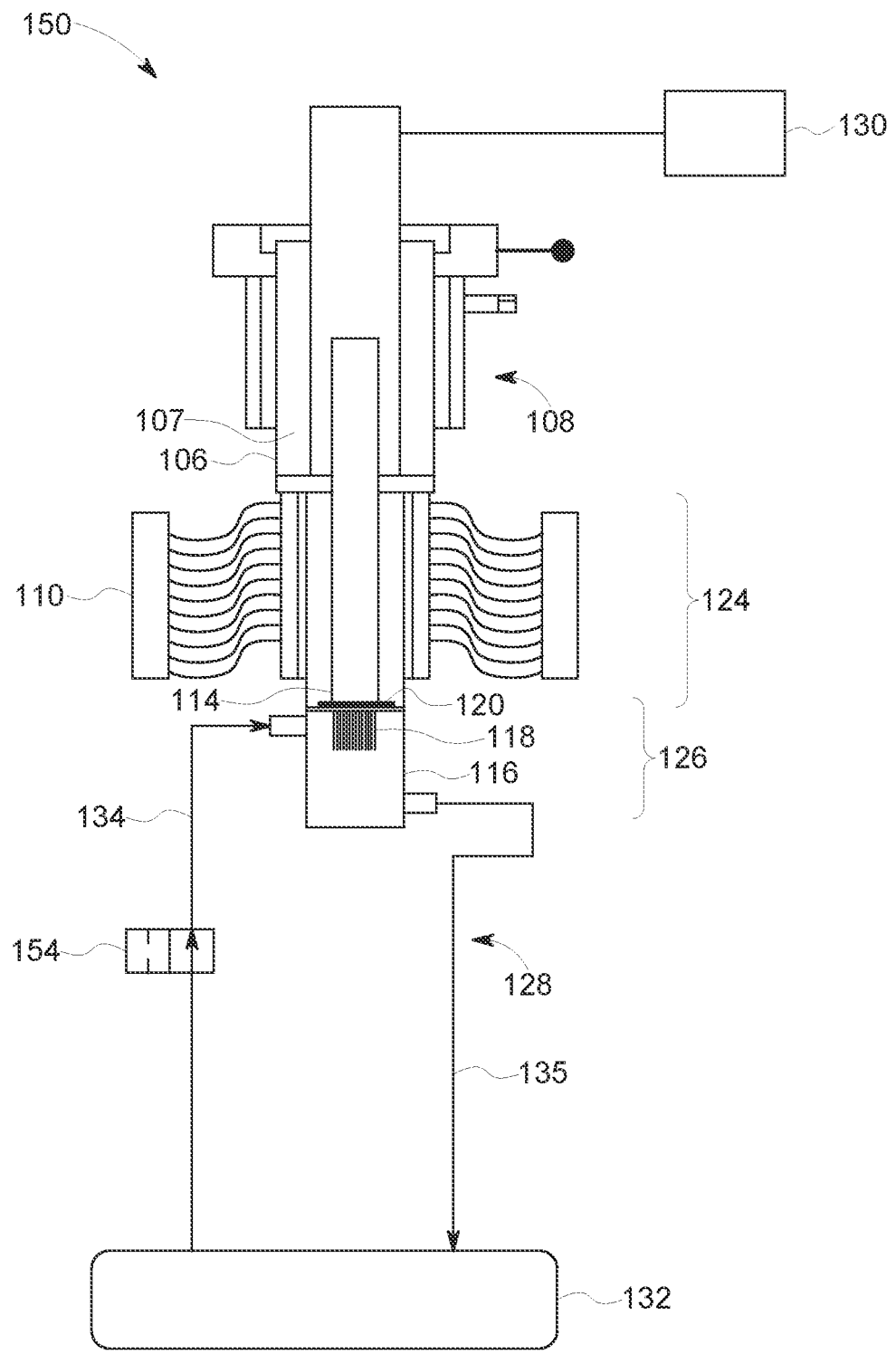
FIG. 4 is a schematic cross-sectional view of an embodiment of a remotely driven cryocooler in an engaged and ON-state of operation, in accordance with one or more embodiments shown or described herein.
Figure 5:
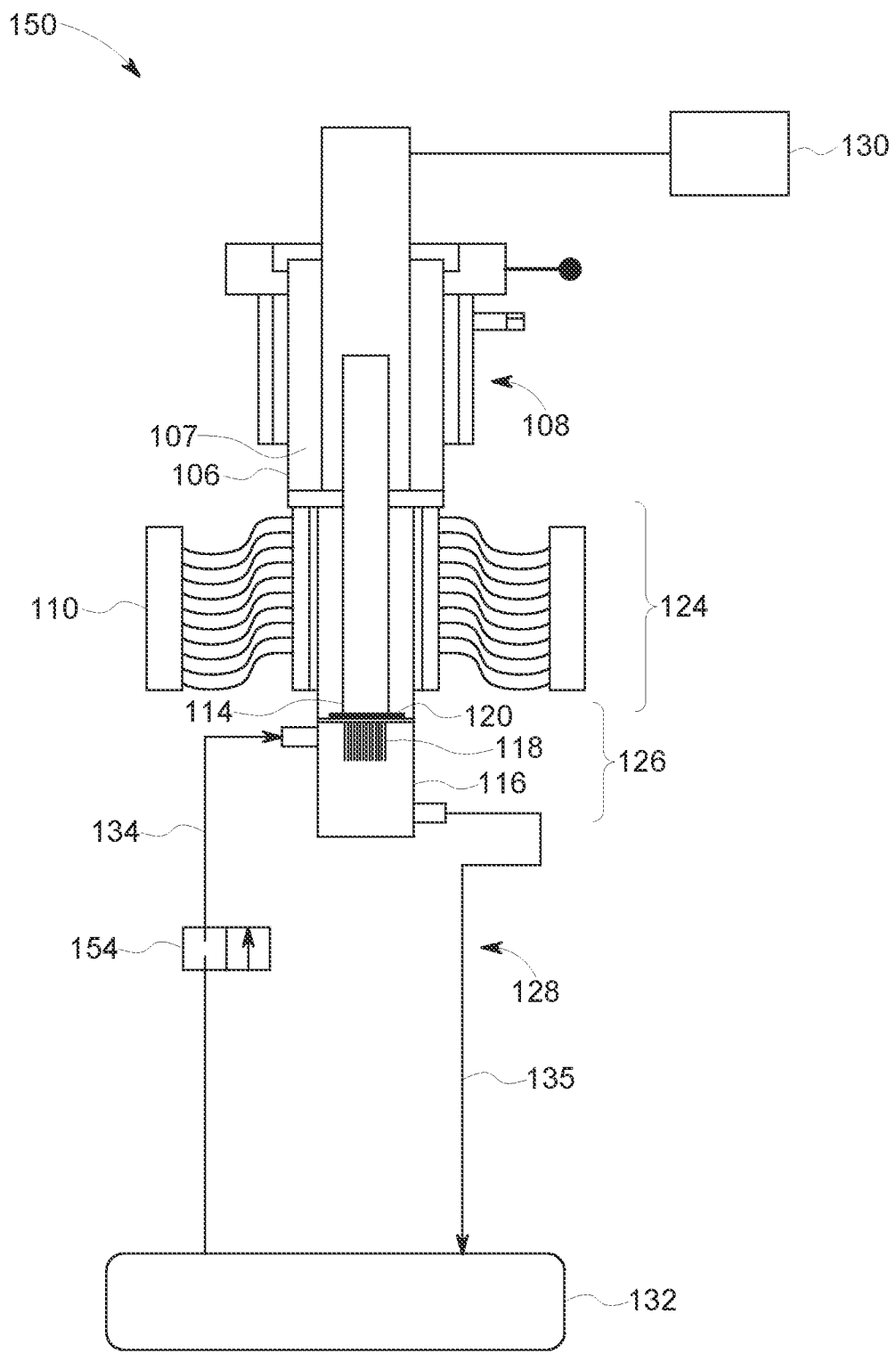
FIG. 5 is a schematic cross-sectional view of the remotely driven cryocooler of FIG. 4 in an engaged and OFF-state of operation, in accordance with one or more embodiments shown or described herein.

Referring more specifically to FIGS. 4 and 5, illustrated is a remotely driven cryocooler assembly 150, illustrating a cryocooler 108 in an engaged and ON-state of operation and in an engaged and OFF-state of operation (idling), respectively. As illustrated, a heat path 128 through the first stage 124 and second stage 126 is present, generally similar to that previously described with reference to FIGS. 2 and 3. As previously described, flexible conduits 134, 135 are used for thermal connection between the second-stage 126 and the cryogenic fluid reservoir 132 as well as protection of the second-stage 126, and more particularly the coldhead 114 from thermal contraction. To provide for remote decoupling of vapor flow from the cryogenic fluid reservoir 132 through the flexible conduit 134 and to the liquefaction fins 118, a solenoid valve 154 is provided in fluid communication with the flexible conduits 134. To provide engagement and contact of the cryocooler 108 with the contact plate 120, an actuator 130 is provided to move the cryocooler 108 relative to the contact plate 120 and lock it into place. In this illustrated embodiment, when the cryocooler 108 is engaged, and in an ON-state of operation, as illustrated in FIG. 4, the vapor transforms into liquid (through recondensation of the vapor on the plurality of liquefaction fins 118) and moves via the flexible conduit 135 back to the cryogenic fluid reservoir 132 at 4 K. Accordingly, during operation of the cryocooler 108, when in the ON-state of operation, the solenoid valve 154 is in an open position, to provide for the flow passage therethrough of the cryogenic vapor to form liquid in the plurality of liquefaction fins 118 and the liquefaction cup 116 and to return liquid back to the cryogenic fluid reservoir 132 via the flexible conduits 134. When the cryocooler 108 is in an engaged and OFF-state of operation (idling), such as that illustrated in FIG. 5, the sleeve 106 and cryocooler 108 are in contact with the second stage 126, and there exists a heat load from the second stage 126. During this OFF-state of operation (idling), the solenoid valve 154 is in a closed position to disconnect the heat path 128 from the cryogenic fluid reservoir 132. When the solenoid valve 154 is in this closed position and preventing vapor from the cryogenic fluid reservoir 132 to cycle through the liquefaction cup 116 and back to the cryogenic fluid reservoir 132, the interface at the contact plate 120 can be heated and the remotely driven cryocooler assembly 150 removed or disengaged.

Figure 6:
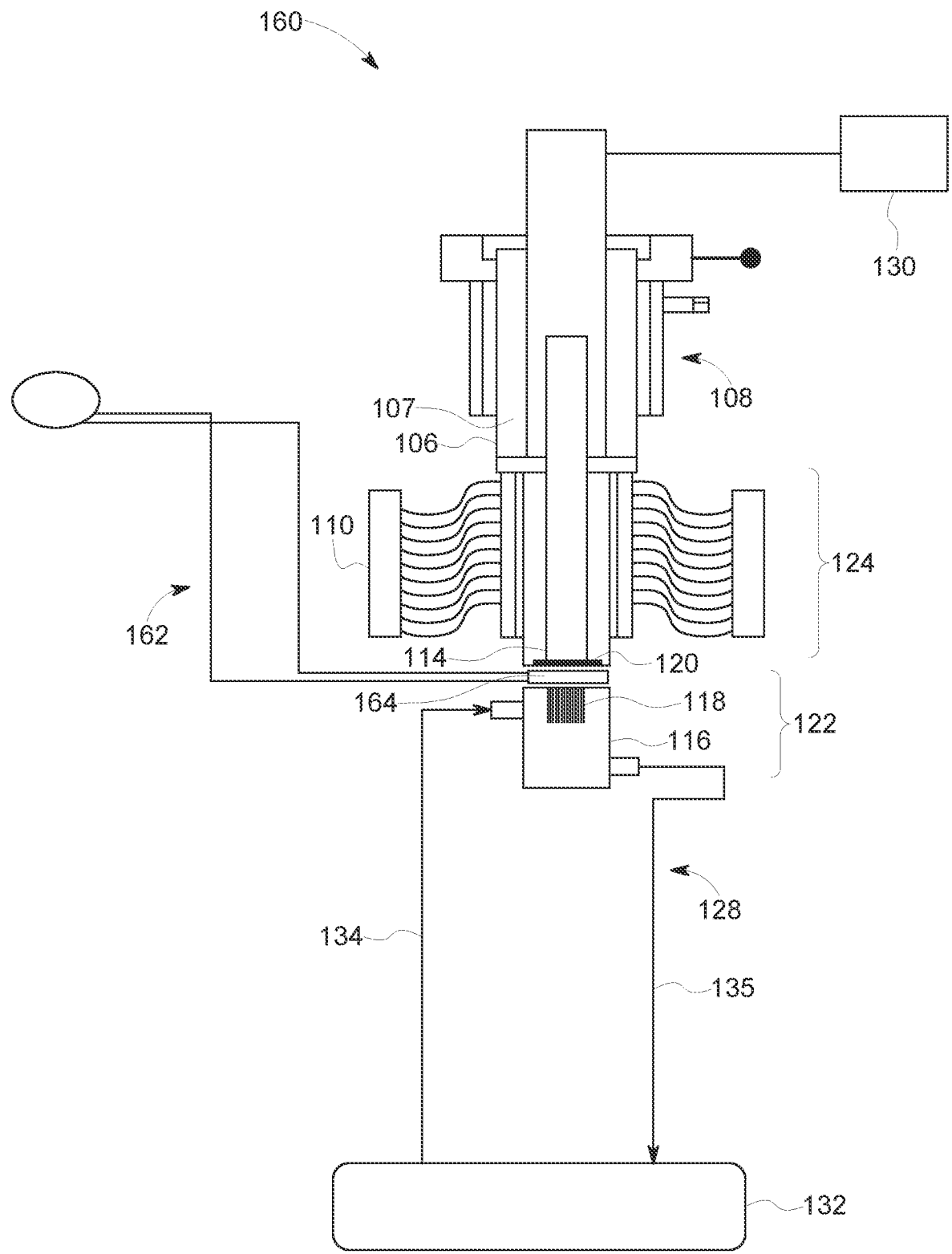
FIG. 6 is a schematic cross-sectional view of another embodiment of a remotely driven cryocooler, in accordance with one or more embodiments shown or described herein.

Referring now to FIG. 6, illustrated is another embodiment of a remotely driven cryocooler assembly 160, illustrating a cryocooler 108 in an OFF-state, or idling, mode of operation. Due to engagement of the cryocooler 108, relative to the sleeve 106, as previously described, a heat path 128 is defined through the first stage 124 and second stage 126 due to radiation and/or convection, generally similar to that previously described with reference to FIGS. 2 and 3.

As previously described, flexible conduits 134, 135 are used for thermal connection between the second-stage 126 and the cryogenic fluid reservoir 132 as well as protection of the second-stage 126, and more particularly the coldhead 114 from thermal contraction. To provide for remote driving of the cryocooler 108, a gas/liquid switch 164, such as a helium switch, is disposed between the lower portion of the sleeve 106 and the fins 118 of the liquefaction cup 116. The gas/liquid switch 164 includes a cavity (not shown) that allows for the introduction of vapor into the cavity. The vapor recondenses and provides a perfect contact between the contact plate 120, the gas/liquid switch 164 and the plurality of liquefaction fins 118. To create a thermal barrier the cavity is evacuated and a vacuum is created. Similar to the previously disclosed embodiments, to provide engagement and contact of the cryocooler 108 with the contact plate 120, an actuator 130 is provided to move the cryocooler 108 relative to the contact plate 120 and lock it into place. In this illustrated embodiment, when the cryocooler 108 is engaged, and in an ON-state of operation (not shown), the gas/liquid switch 164 is closed (contains liquid helium) to allow the vapor from the cryogenic fluid reservoir 132 and the flexible conduit 134 to transform into vapor, and move the recondensed liquid via the flexible conduit 135 to the cryogenic fluid reservoir 132 at 4 K. Accordingly, during operation of the cryocooler 108, when in the ON-state of operation, the gas/liquid switch 164 is in a closed position, to allow recondensation of vapor along the flexible conduit 134 through the liquefaction fins 118 and out of the liquefaction cup 116 to the cryogenic fluid reservoir 132 via flexible conduit 135. When the cryocooler 108 is in an engaged and OFF-state of operation (idling), such as that illustrated in FIG. 6, the sleeve 106 and cryocooler 108 are in contact with the second stage 126, and there exists a heat load from the second stage 126. During this OFF-state of operation (idling), the gas/liquid switch 164 is in an open position to disconnect the heat path 128. In this case the switch is evacuated (similar to the heat pipe of FIG. 9 described presently) and a thermal resistance is created between the contact plate 120, the gas/liquid switch 164 and the plurality of liquefaction fins 118.

Figure 7:
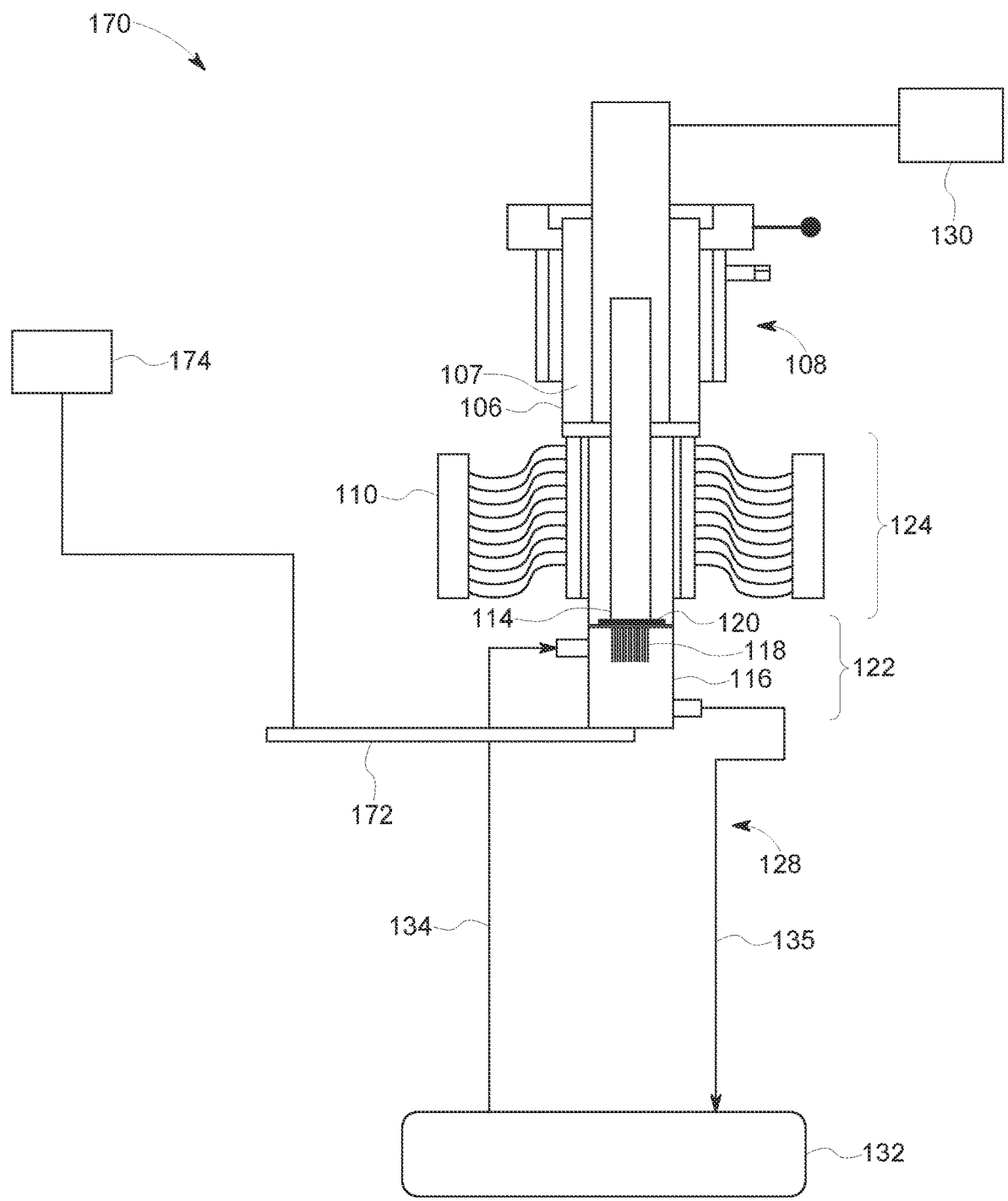
FIG. 7 is a schematic cross-sectional view of another embodiment of a remotely driven cryocooler in an engaged and ON-state of operation, in accordance with one or more embodiments shown or described herein.
Figure 8:
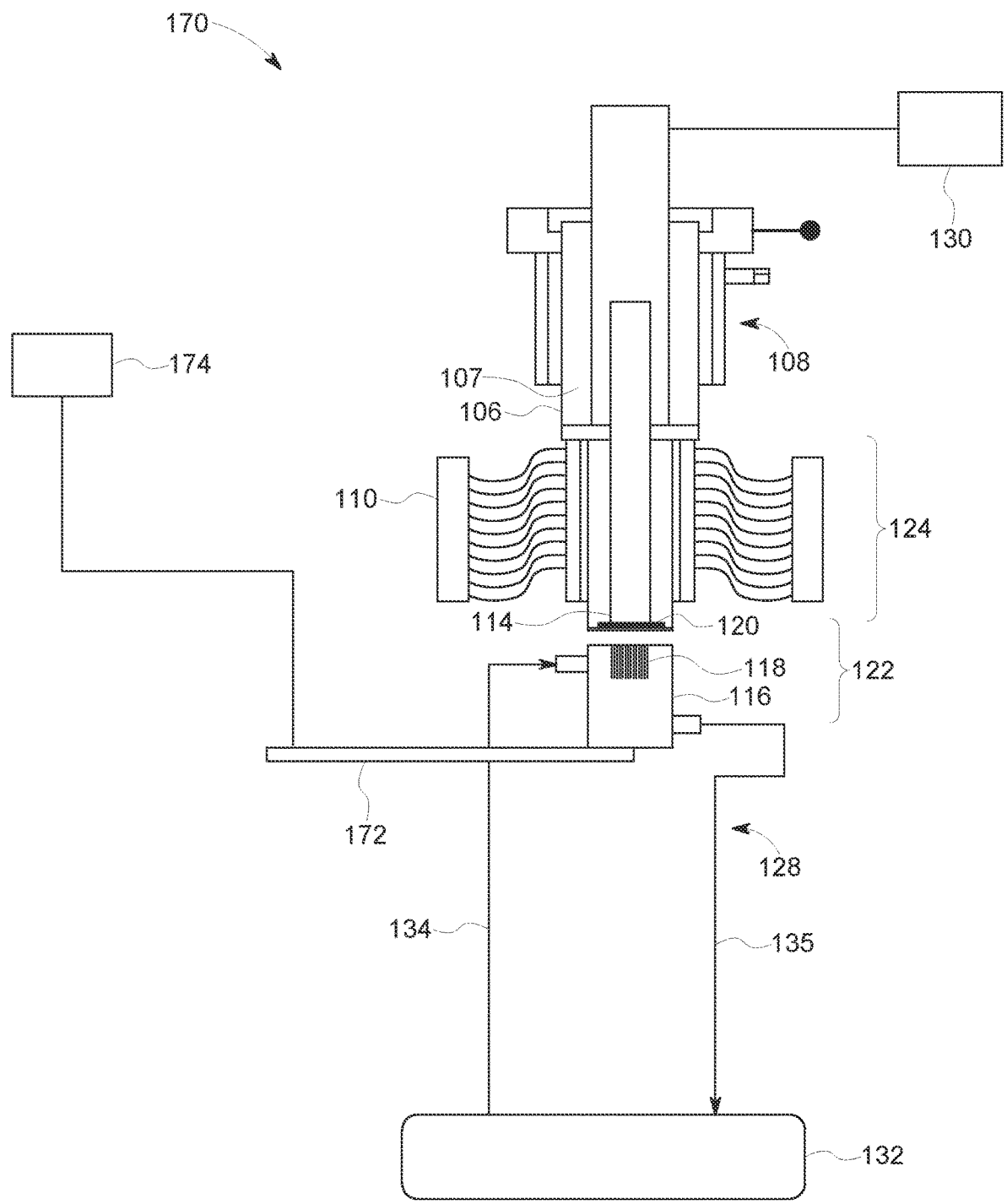
FIG. 8 is a schematic cross-sectional view of the remotely driven cryocooler of FIG. 7 in an engaged and OFF-state of operation, in accordance with one or more embodiments shown or described herein.

Referring now to FIGS. 7 and 8, illustrated is another embodiment of a remotely driven cryocooler assembly 170, illustrating a cryocooler 108 in an ON-state and in an OFF-state of operation, respectively. In the OFF-state of operation (idling) a heat load by radiation through the first stage 124 and second stage 126 is present, generally similar to that previously described with reference to FIGS. 2 and 3.

In the illustrated embodiment, a support arm 172 is coupled to the liquefaction cup 116 and an actuator 174. The support arm 172 is utilized to move (using a force) the liquefaction cup 116 relative to the bottom of sleeve 106, so as to place the liquefaction cup 116 in thermal contact with the contact plate 120, or disengage the liquefaction cup 116 from the contact plate 120. In the ON-state of operation, as illustrated in FIG. 7, the liquefaction cup 116 is moved to rigidly engage with the contact plate 120 and allow circulation of the vapor/liquid via the flexible conduits 134 to the cryogenic fluid reservoir 132 at 4 K. In the OFF-state of operation, as illustrated in FIG. 8, when there is a heat load by radiation and conduction through the first stage 124, second stage 126 and the sleeve 106, the support arm 172 lowers the liquefaction cup 116 so as to disengage the liquefaction cup 116 from the contact plate 120 and from the heat load caused by the remotely driven cryocooler assembly 170.

Figure 9:
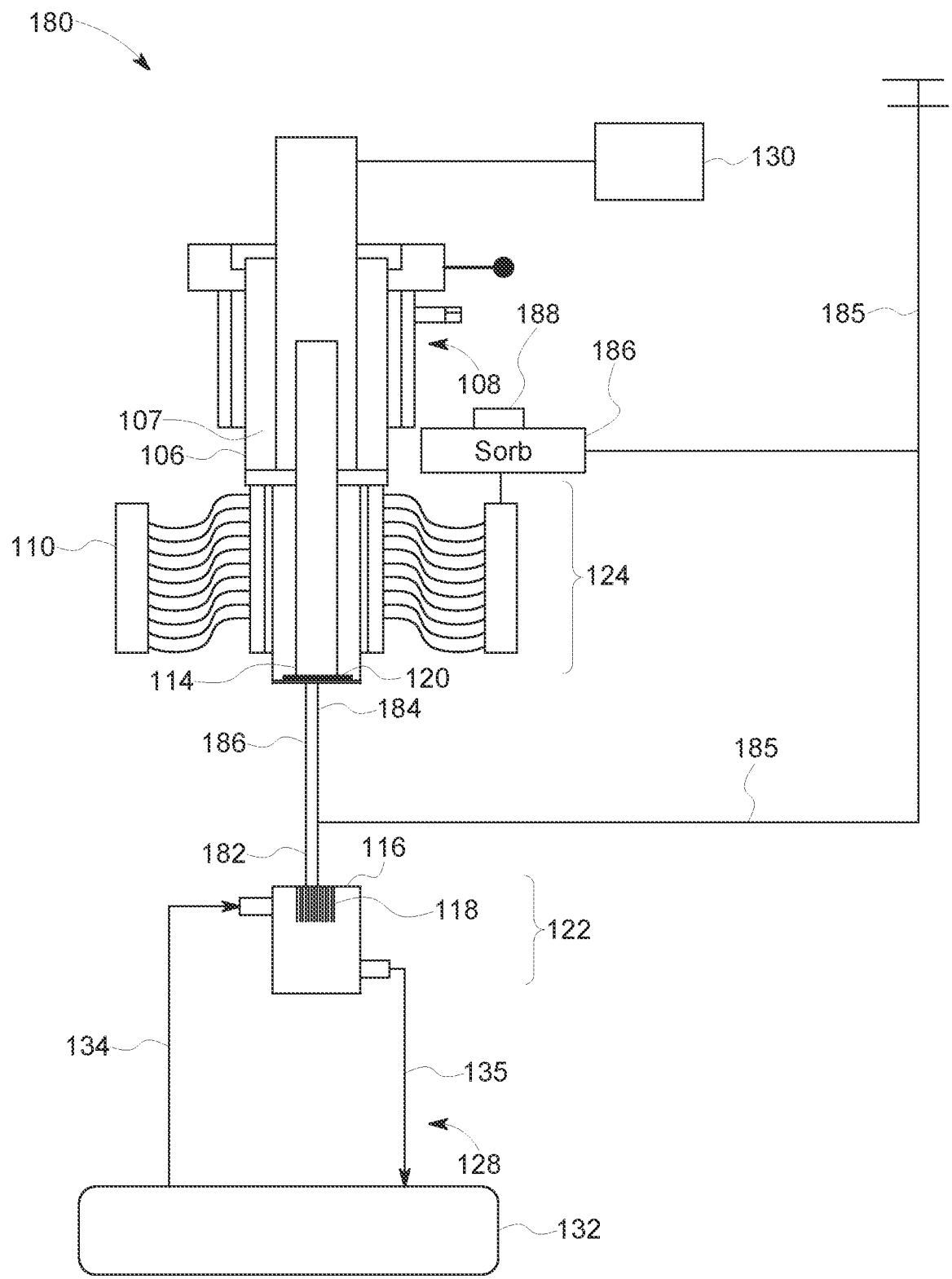
FIG. 9 is a schematic cross-sectional view of another embodiment of a remotely driven cryocooler, in accordance with one or more embodiments shown or described herein.

Referring now to FIG. 9, illustrated is another embodiment of a remotely driven cryocooler assembly 180, illustrating a cryocooler 108 engaged within a sleeve and in an OFF-state of operation. A heat load by radiation and conduction through the first stage 124 and second stage 126 is present, generally similar to that previously described with reference to FIGS. 2 and 3. In this illustrated embodiment, a heat pipe 182 is disposed between, and in thermal contact at a first end 184 with the contact plate 120 and at a second end 186 with the liquefaction cup 116. When the cryocooler 108 is in the OFF-state of operation (idling), the cryogenic fluid needs to be pumped out of the heat pipe 182 via lines 185 or by using a cryosorb 186 in contact with the first stage 124 and lines 185. When the cryocooler 108 is in the ON-state of operation, the heat pipe 182 is initially filled with gaseous helium at overpressure, allowing the cryogenic fluid to recondense and circulate within the heat pipe 182 and allow for recondensing to occur at the plurality of liquefaction fins 118 via the flexible conduits 134, 135 to the cryogenic fluid reservoir 132 at 4 K. In an embodiment, the cryosorb 186 includes a heater 188.

Figure 10:
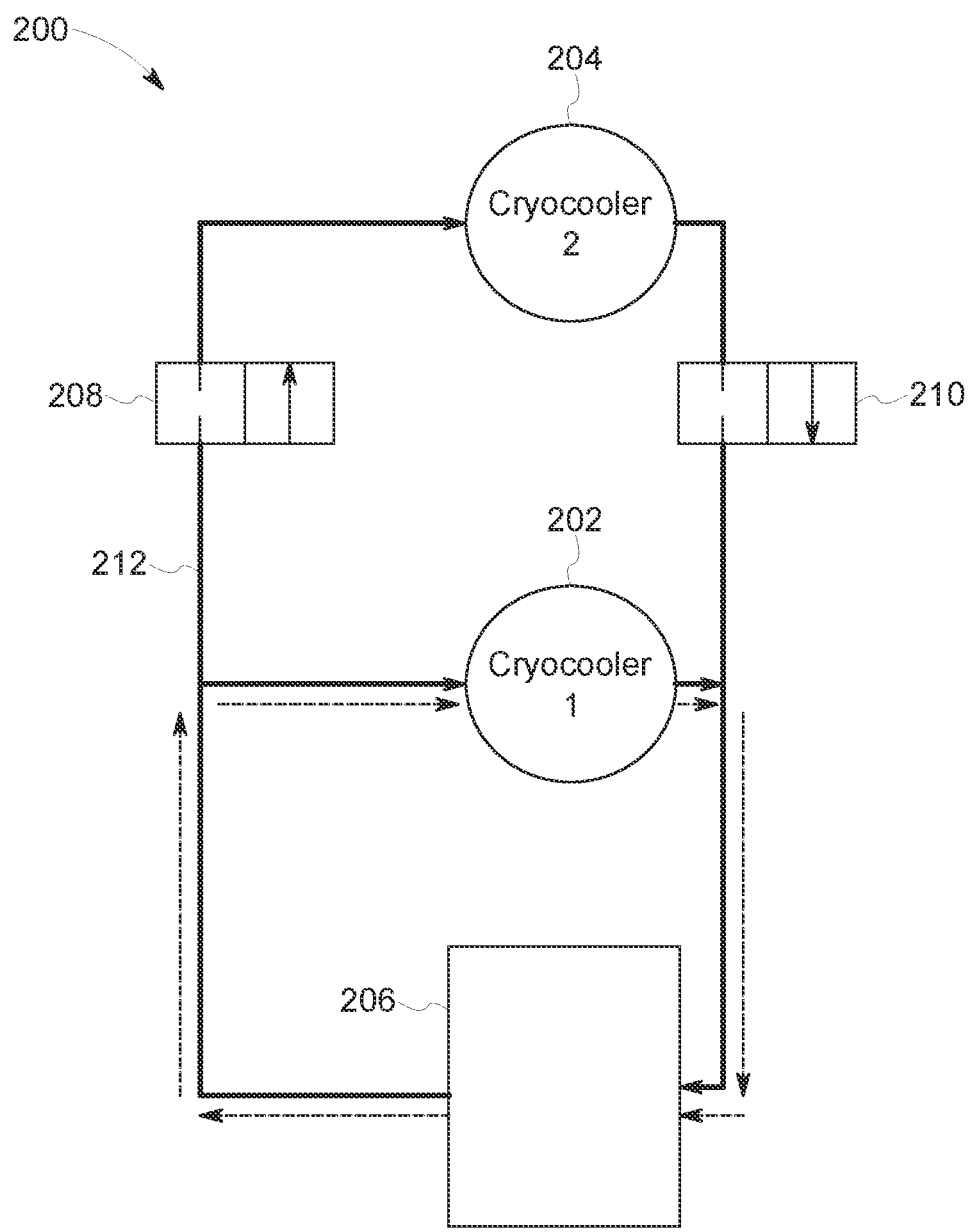
FIG. 10 is an embodiment of a drive circuit for controlling a remotely driven cryocooler assembly wherein the remotely driven cryocooler assembly is in an OFF-state of operation, in accordance with one or more embodiments shown or described herein.
Figure 11:
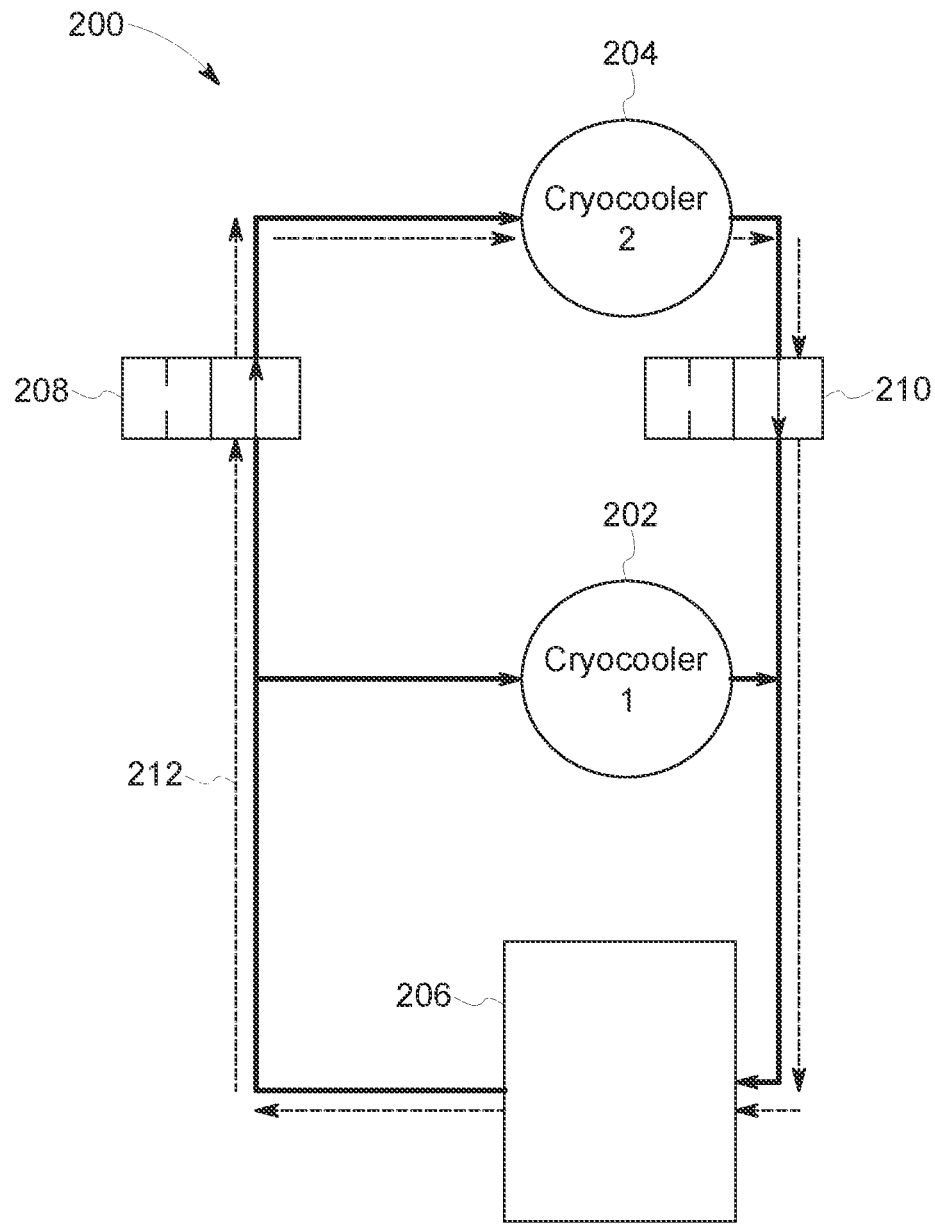
FIG. 11 is the drive circuit of FIG. 10 wherein the remotely driven cryocooler assembly is in an ON-state of operation, in accordance with one or more embodiments shown or described herein.

Referring now to FIGS. 10-14, illustrated are embodiments of a control circuit for the remotely driven idling and non-idling cryocoolers, as described with reference to FIGS. 2-9. Referring more specifically to FIGS. 10 and 11, illustrated is an embodiment of a control circuit, generally referenced 200. The control circuit 200 includes a first cryocooler 202, a second cryocooler 204, a compressor 206, a first valve 208, such as a solenoid valve, and an optional second valve 210. A plurality of high pressure lines 212, such as flex lines, or copper lines with Aeroquip® fittings may be utilized. The second cryocooler 204 is noted as capable of being remotely driven by any of the means previously described in FIGS. 4-9.

Referring more specifically to FIG. 10, illustrated is the first cryocooler 202 in an engaged and ON-state of operation. The second cryocooler 204 is in an engaged or disengaged status, and an OFF-state of operation. In the illustrated embodiment, the second cryocooler 204 is a remotely driven cryocooler, such as previously described with respect to FIGS. 4-9. The first valve 208 is in a closed position to prevent the flow of the cryogenic fluid therethrough and thereby bypass the second cryocooler 204 which is in an OFF-state of operation (idling). The optional second valve 210, if present, is also in a closed position. During operation of the first cryocooler 202, the cryogenic fluid flows from the first cryocooler 202 to the compressor 206 via the high pressure lines 212, as noted by dashed lines.

As the first cryocooler 202 reaches its end of life, and is either without power, or switched to an OFF-state of operation, the second cryocooler 204 is engaged and remotely switched to an ON-state of operation, as best illustrated in FIG. 11. To provide for the flow of the cryogenic fluid therethrough, the first valve 208 is opened, and if present, the optional second valve 210 is opened. During operation of the second cryocooler 204, the cryogenic fluid flows from the second cryocooler 204 to the compressor 206 via the high pressure lines 212 as noted by dashed lines.

Figure 12:
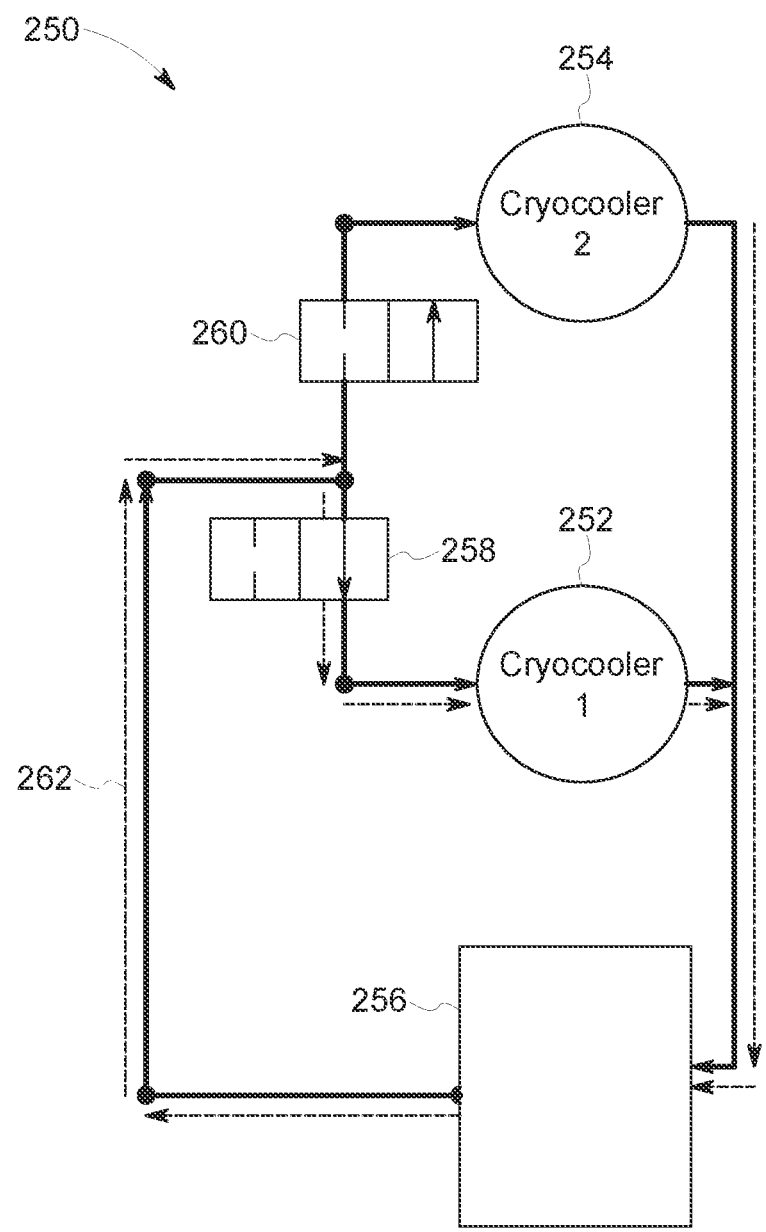
FIG. 12 is another embodiment of a drive circuit for controlling a remotely driven cryocooler wherein the remotely driven cryocooler assembly is in an OFF-state of operation, in accordance with one or more embodiments shown or described herein.
Figure 13:
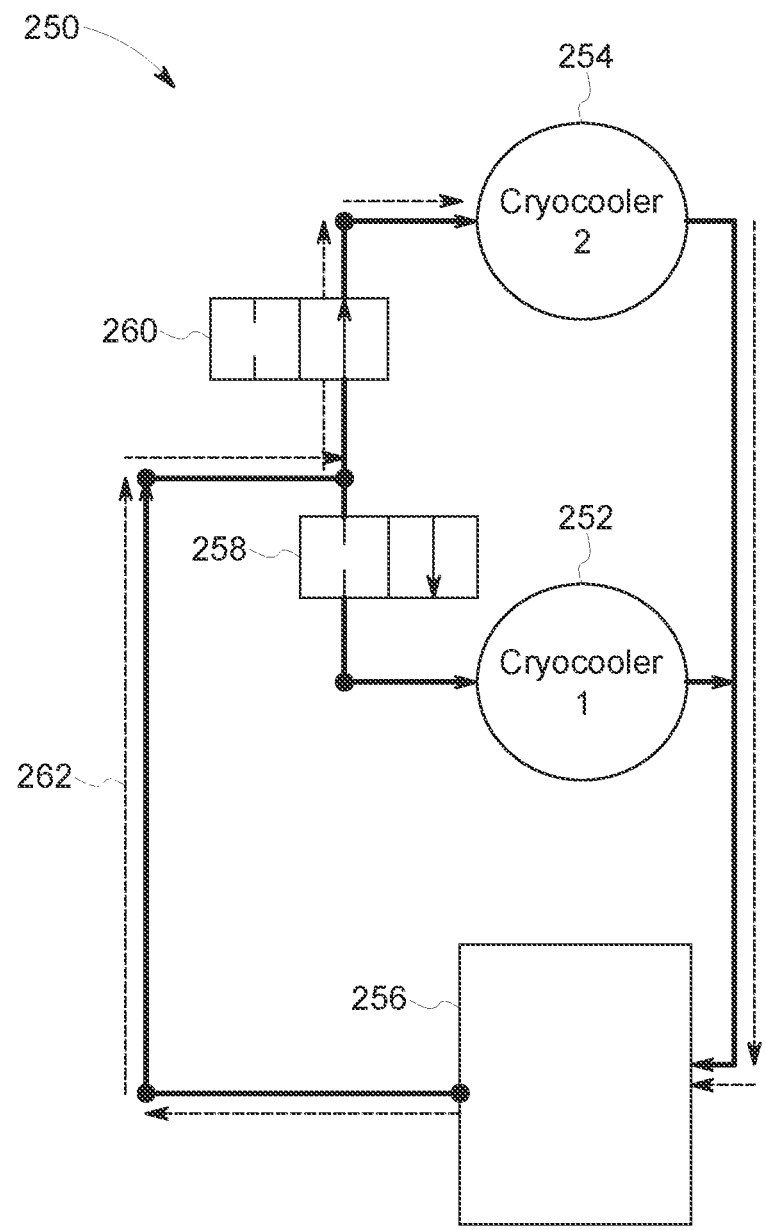
FIG. 13 is the drive circuit of FIG. 12 wherein the remotely driven cryocooler assembly is in an ON-state of operation, in accordance with one or more embodiments shown or described herein.

Referring now to FIGS. 12 and 13, illustrated is another embodiment of a control circuit, generally referenced 250. The control circuit 250 includes a first cryocooler 252, a second cryocooler 254, a compressor 256, a first valve 258, such as a solenoid valve, and a second valve 260. A plurality of high pressure lines 262, such as flex lines, or copper lines with Aeroquip® fittings may be utilized. The second cryocooler 254 is noted as capable of being remotely driven by any of the means previously described in FIGS. 4-9.

Referring more specifically to FIG. 12, illustrated is the first cryocooler 252 in an engaged and ON-state of operation. The second cryocooler 254 is in an engaged or disengaged status, and an OFF-state of operation. The first valve 258 is in an open position to provide for the flow of the cryogenic fluid therethrough. The second valve 260 is in a closed position to prevent the flow of the cryogenic fluid therethrough and thereby bypass the second cryocooler 254 which is in an idling state. During operation of the first cryocooler 252, the cryogenic fluid flows from the first cryocooler 252 to the compressor 256 via the high pressure lines 262, as noted by dashed lines.

As the first cryocooler 252, for example, reaches its end of life, and is either without power, or switched to an OFF-state of operation, the second cryocooler 254 is engaged and remotely switched to an ON-state of operation, as best illustrated in FIG. 13. The first valve 258 is in a closed position to prevent the flow of the cryogenic fluid therethrough and thereby bypass the first cryocooler 252. The second valve 260 is in an open position to provide for the flow of the cryogenic fluid therethrough. During operation of the second cryocooler 254, the cryogenic fluid flows from the second cryocooler 254 to the compressor 256 via the high pressure lines 262 as noted by dashed lines.

Figure 14:
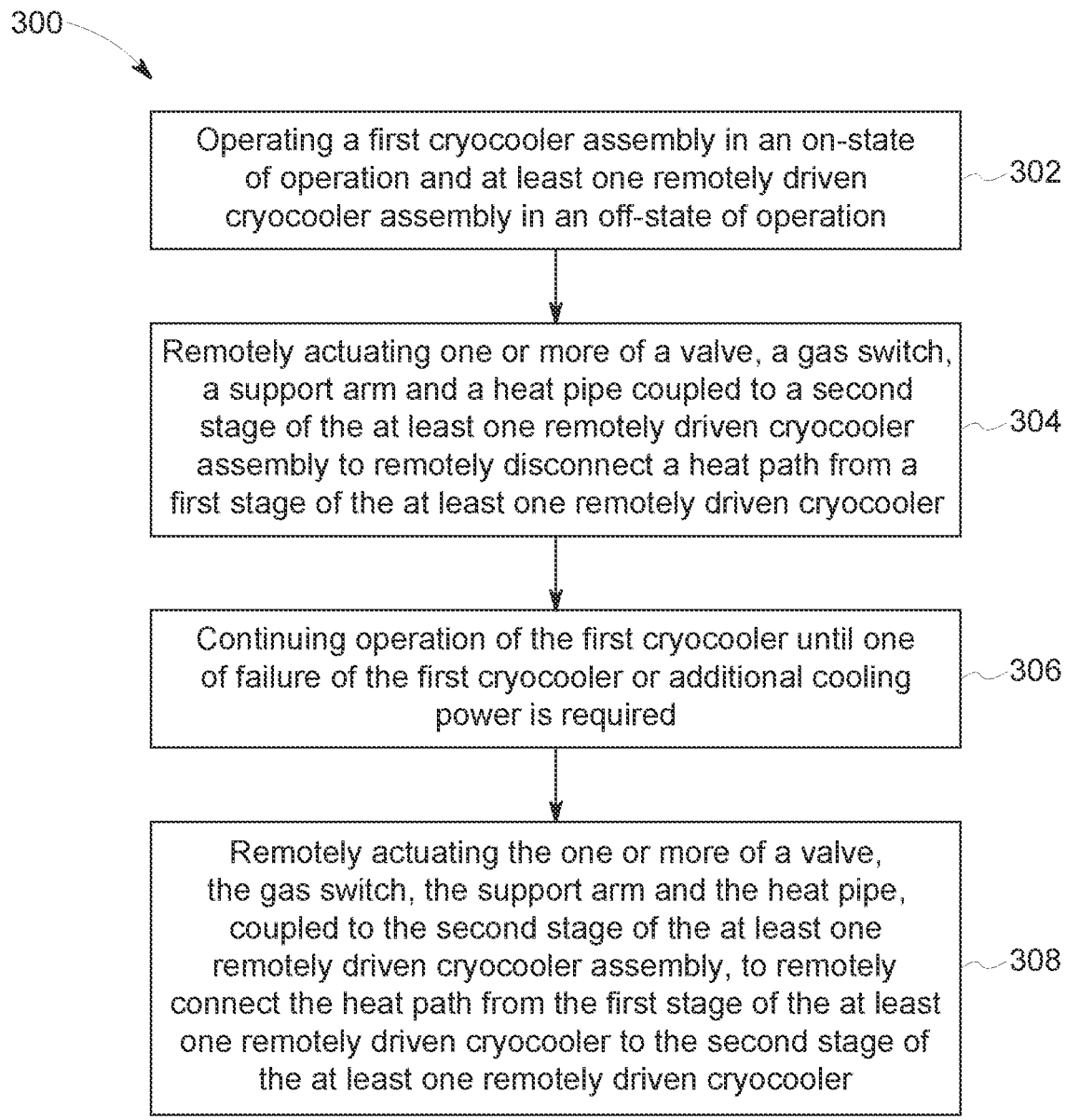
FIG. 14 is a flowchart illustrated a method of operating a cooling assembly for a superconducting generator, in accordance with one or more embodiments shown or described herein.

Illustrated in FIG. 14 is a method of operating a cooling assembly for a superconducting generator, wherein the cooling assembly comprises a first cryocooler assembly and at least one remotely driven cryocooler assembly. The method, generally referenced 300, includes a first step 302 of operating the first cryocooler assembly in an ON-state of operation and the at least one remotely driven cryocooler assembly in an OFF-state of operation. During this step, a heat path is generated between a first stage and a second stage of the at least one remotely driven cryocooler assembly during the OFF-state of operation. A step 304 includes remotely actuating one or more of a valve, a gas/liquid switch, a support arm and a heat pipe. Each of the valve, the gas/liquid switch, the support arm and the heat pipe are coupled to the second stage of the at least one remotely driven cryocooler assembly to remotely disconnect the heat path from the first stage of the at least one remotely driven cryocooler. In a step 306, operation of the first cryocooler is continued until the first cryocooler reaches its end of life and fails or additional cooling power is required. At this point, the first cryocooler is automatically disengaged, and the one or more of a valve, the gas/liquid switch, the support arm and the heat pipe, coupled to the second stage of the at least one remotely driven cryocooler assembly is remotely actuated, in a step 308, to remotely connect the heat path from the first stage of the at least one remotely driven cryocooler to the second stage of the at least one remotely driven cryocooler.

In accordance with the embodiments described herein, an improved redundant cryocooler assembly, including one or more remotely driven cryocoolers, for use in a superconducting generator such as the superconducting generator 10 are provided. The improvements in the redundant cryocooler assembly may be achieved due to the inclusion of one or more remotely driven cryocoolers, in accordance with embodiments of the present disclosure. In addition, the improvements in the redundant cryocooler assembly may be achieved due to operation by a specific drive circuit for the one or more remotely driven cryocoolers, in accordance with embodiments of the present disclosure. In a wind turbine superconducting generator the improved remotely driven cryocooler assembly eliminates maintenance at the tower or nacelle when one cryocooler fails or several cryocoolers show reduced cooling power over time.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspect, can be mixed and matched by one of ordinary skill in the art to construct additional embodiments and techniques in accordance with principles of this application.

What is claimed is:

1. A cryocooler assembly comprising:
   at least one remotely driven cryocooler operable between an ON-state of operation and an OFF-state of operation and defining a first stage of the cryocooler assembly;
   the remotely driven cryocooler movable within a sleeve;
   a cryogenic fluid reservoir;
   a plurality of conduits;
   a liquefaction cup in fluidic communication with the cryogenic fluid reservoir, wherein the plurality of conduits thermally couple the liquefaction cup to the cryogenic fluid reservoir and define a second stage of the cryocooler assembly;
   a plurality of fins within the liquefaction cup;
   a heat path generated by the remotely driven cryocooler between the first stage and the second stage;
   a contact plate disposed at a lower end of the sleeve, the contact plate in thermal contact with the plurality of fins when the cryocooler is in the ON-state of operation; and
   means for disconnecting the thermal contact between the contact plate and the plurality of fins when the cryocooler is in the OFF-state of operation to disconnect the heat path between the first stage and the second stage during the OFF-state of operation;
wherein the means for disconnecting the thermal contact comprises one of the following:
a gas/liquid switch disposed between the contact plate and the plurality of fins, the gas/liquid switch comprising a cavity that is filled with a gas in a closed state of the gas/liquid switch and is evacuated of the gas in an open state of the gas/liquid switch to disconnect the thermal contact;
a support arm coupled to the liquefaction cup to translate the liquefaction cup to thermally engage and thermally disengage the liquefaction cup from the contact plate; or
a heat pipe coupled at a first end to the first stage of the cryocooler assembly and a second end coupled to the second stage of the cryocooler assembly.

2. The assembly of claim 1, wherein the sleeve is indirectly coupled to a stationary superconducting field winding of a superconducting generator.

3. The assembly of claim 2, wherein the remotely driven cryocooler further comprises a coldhead in thermal engagement with a cryogenic fluid.

4. The assembly of claim 3, further comprising a remotely operable actuator coupled to the at least one remotely driven cryocooler, the actuator configured to translate the cryocooler coldhead relative to the contact plate.

5. The assembly of claim 4, wherein the remotely operable actuator is configured to translate the coldhead to one of remotely thermally engage or thermally disengage the coldhead with the contact plate.

6. The assembly of claim 4, wherein the remotely operable actuator includes at least one of a hydraulic actuator, a pneumatic actuator, an electric actuator, a piezoelectric actuator, a moving iron controllable actuator, or a vacuum.

7. The assembly of claim 1, wherein the gas in the gas/liquid switch is helium.

8. The assembly of claim 1, wherein the at least one remotely driven cryocooler includes at least one of a pulse tube type, a GM type, or a Stirling type cooler.

9. A superconducting generator comprising:
a housing extending a first length and defining an insulating vacuum enclosure therein;
at least one superconducting field winding disposed within the insulating vacuum enclosure and spaced apart from the housing;
a thermal shield disposed within the insulating vacuum enclosure and surrounding and spaced apart from the at least one superconducting field winding; and
a cooling assembly in fluid communication with the at least one superconducting field winding, the cooling assembly comprising:
at least one cryocooler assembly operable between an ON-state of operation and an OFF-state of operation; and
at least one additional cryocooler assembly operable between an ON-state of operation and an OFF-state of operation, wherein the at least one additional cryocooler comprises:
a remotely driven cryocooler operable between an ON-state of operation and an OFF-state of operation and defining a first stage of the at least one additional cryocooler assembly;
the remotely driven cryocooler movable within a sleeve;
a cryogenic fluid reservoir;
a plurality of conduits;
a liquefaction cup in fluidic communication with the cryogenic fluid reservoir, wherein the plurality of conduits thermally couple the liquefaction cup to the fluid reservoir and define a second stage of the at least one additional cryocooler assembly;
a plurality of fins within the liquefaction cup;
a heat path generated by the remotely driven cryocooler between the first stage and the second stage;
a contact plate disposed at a lower end of the sleeve, the contact plate in thermal contact with the plurality of fins when the cryocooler is in the ON-state of operation; and
means for disconnecting the thermal contact between the contact plate and the plurality of fins when the cryocooler is in the OFF-state of operation to disconnect the heat path between the first stage and the second stage during the OFF-state of operation;
wherein the means for disconnecting the thermal contact comprises one of the following:
a gas/liquid switch disposed between the contact plate and the plurality of fins, the gas/liquid switch comprising a cavity that is filled with a gas in a closed state of the gas/liquid switch and is evacuated of the gas in an open state of the gas/liquid switch to disconnect the thermal contact;
a support arm coupled to the liquefaction cup to translate the liquefaction cup to thermally engage and thermally disengage the liquefaction cup from the contact plate; or
a heat pipe coupled at a first end to the first stage of the cryocooler assembly and a second end coupled to the second stage of the cryocooler assembly.

10. The superconducting generator of claim 9, wherein the gas in the gas/liquid switch is helium.

11. The superconducting generator of claim 9, wherein the cooling assembly includes at least one of a pulse tube type, a GM type, and a Stirling type cooler.

* * * * *